US008409727B2

(12) United States Patent
Yang et al.

(10) Patent No.: US 8,409,727 B2
(45) Date of Patent: Apr. 2, 2013

(54) COLOR FILTER ARRAY AND ORGANIC LIGHT-EMITTING DISPLAY DEVICE USING THE SAME

(75) Inventors: Seung Gak Yang, Yongin (KR); Hee Yeon Kim, Yongin (KR); Chang Ho Lee, Yongin (KR); Jung Han Shin, Yongin (KR); Hee Joo Ko, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 859 days.

(21) Appl. No.: 11/584,460

(22) Filed: Oct. 20, 2006

(65) Prior Publication Data

US 2007/0146915 A1 Jun. 28, 2007

(30) Foreign Application Priority Data

| Dec. 28, 2005 | (KR) | 10-2005-0131548 |
| Dec. 28, 2005 | (KR) | 10-2005-0131549 |
| Dec. 28, 2005 | (KR) | 10-2005-0131550 |

(51) Int. Cl.
*H01L 51/54* (2006.01)

(52) U.S. Cl. ........ 428/690; 428/917; 359/885; 359/890; 313/504; 257/E51.001

(58) Field of Classification Search .................. None
See application file for complete search history.

(56) References Cited

U.S. PATENT DOCUMENTS

| 3,736,050 A | 5/1973 | Bolum |
| 5,949,188 A | 9/1999 | Leising et al. |
| 6,137,221 A * | 10/2000 | Roitman et al. ............. 313/504 |
| 6,195,142 B1 * | 2/2001 | Gyotoku et al. ................ 349/69 |
| 6,506,506 B1 * | 1/2003 | Tomiuchi et al. ............. 428/690 |
| 6,737,800 B1 | 5/2004 | Winters et al. |
| 6,844,670 B2 | 1/2005 | Kuma et al. |
| 2003/0127968 A1 | 7/2003 | Kuma et al. |
| 2004/0169461 A1 * | 9/2004 | Moriyama et al. ........... 313/503 |
| 2004/0265253 A1 * | 12/2004 | Seo et al. ........................ 424/63 |
| 2005/0089713 A1 | 4/2005 | Satsuki et al. |
| 2005/0089772 A1 * | 4/2005 | Kawaguchi et al. ............. 430/7 |
| 2005/0116619 A1 * | 6/2005 | Kuma et al. .................... 313/503 |
| 2005/0248929 A1 | 11/2005 | Kawamura et al. |

FOREIGN PATENT DOCUMENTS

| EP | 0 884 370 A2 | 12/1998 |
| JP | 10-255983 | 9/1998 |
| JP | 10255983 A * | 9/1998 |
| JP | 2005-100939 | 4/2005 |
| JP | 2005-243549 | 9/2005 |
| KR | 2003-0013700 | 2/2003 |
| KR | 2003-0057634 | 7/2003 |
| KR | 10-2004-0058293 | 7/2004 |
| WO | WO 2005/034582 A1 | 4/2005 |
| WO | WO 2006/028089 A1 | 3/2006 |

OTHER PUBLICATIONS

Machine translation of JP10-255983. Date of publication: Sep. 25, 1998.*
European Search Report dated May 29, 2007, for EP06256599.9, in the name of Samsung SDI Co., Ltd.
Korean Patent Abstracts, Publication No. KR 1020030013700 A, Feb. 15, 2003, in the name of Han et al.
Korean Patent Abstracts, Publication No. KR 1020030057634 A, Jul. 7, 2003, in the name of Park et al.
Japanese Office action dated Sep. 29, 2009, for corresponding Japanese application 2006-135077.
European Communication, Summons to attend oral proceedings pursuant to Rule 115(1)EPC, dated Mar. 11, 2011, for corresponding European Patent application 06256599.9.
Coumarin 6, http://web.archive.org/web/19990830085352/http://omlc.ogi.edu/spectra/PhotochemCAD/html/coumarin6.html, Aug. 30, 1999, 2 pages.
Japanese Patent Office action dated Sep. 30, 2012 in JP Application No. 2010-235462 (3 pages).

* cited by examiner

*Primary Examiner* — Jennifer A Chriss
*Assistant Examiner* — Andrew K Bohaty
(74) *Attorney, Agent, or Firm* — Christie, Parker & Hale, LLP (57) ABSTRACT

A color filter array is provided that is capable of implementing full color with improved light-emitting efficiency and color coordinate values from a mixed light of blue and red, and an organic light-emitting display device using the same. A color filter array receiving a mixed light of blue wavelength light and red wavelength light to implement full color according to an embodiment of the invention comprises a red filter, a green filter, and a blue filter. The red filter includes a first color conversion material for converting the blue wavelength light into green light and red light and a green blocking material for blocking the green light. The green filter includes a second color conversion material for converting the blue wavelength light into green light and red light and a red blocking material for blocking the red light. The blue filter includes a red blocking material for blocking the red wavelength light.

33 Claims, 7 Drawing Sheets

COLOR FILTER ARRAY AND ORGANIC LIGHT-EMITTING DISPLAY DEVICE USING THE SAME

CROSS-REFERENCE TO RELATED APPLICATIONS

This application claims priority to and the benefit of Korean Patent Application Nos. 2005-131548, 2005-131549 and 2005-131550, all filed on Dec. 28, 2005 in the Korean Intellectual Property Office, the entire disclosures of which are incorporated herein by reference.

BACKGROUND

The invention relates to a color filter array and a flat display device using the same, and more particularly, to a color filter array capable of implementing full color with improved light-emitting efficiency and color coordinate values from a mixed light of blue and red, and an organic light-emitting display device.

Further, the invention relates to an organic light-emitting display device in which a light-emitting layer can be easily formed, and the color coordinate values of the light-emitting layer do not vary severely according to the driving voltage and current density.

As a method of implementing full color in a flat display device, particularly, an organic light-emitting element, generally, a 3-color light-emitting method, a color filter method, and a color conversion method are well known. The 3-color light-emitting method uses the respective Red (R), Green (G), Blue (B) light sources to emit red light, green light, and blue light, the color filter method splits light primarily from a white colored light-emitting source through a color filter into red light, green light, and blue light, and the color conversion method splits light from a blue light-emitting source into red light, green light, and blue light using a color conversion material (phosphor) instead of a color filter.

The 3 color light-emitting method has a problem in that the lifespan of any one color determines the lifespan of the entire system, the color filter method has a problem in that the amount of light is decreased since white color is absorbed into a color filter, and the color conversion method has a problem in that a color conversion material is excited by blue light, thereby reducing contrast.

Figure 1:
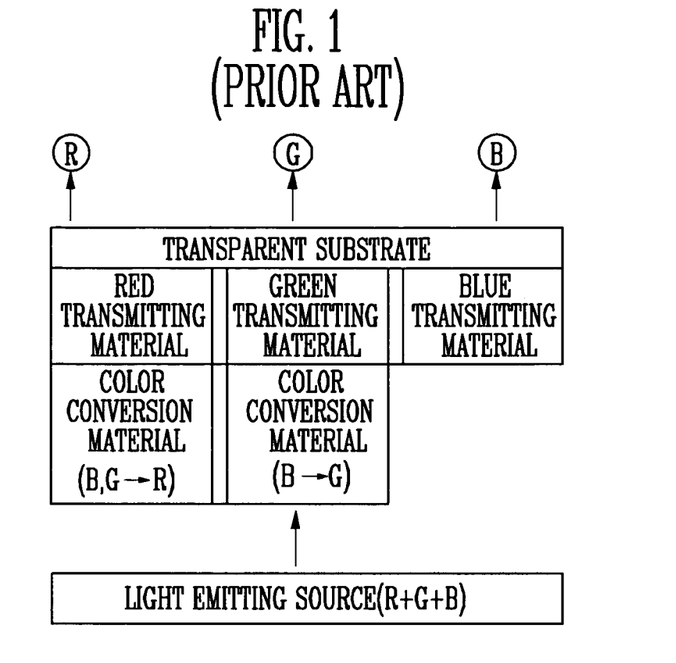
FIG. 1 is a schematic diagram of a color filter array according to the prior art.

A color light-emitting device is disclosed in FIG. 1, which is a schematic diagram of a conventional color light-emitting device. The device includes a red filter for converting blue light and green light from white light to red light and transmitting only red light, and a green filter for converting blue light from white light to green light and transmitting only green light. However, the color light-emitting device has problems in using three wavelengths in which the light-emitting efficiency and color purity of red light is not good, the variation of color coordinate values of the 3 color light-emitting sources is severe, and its manufacturing process is complex.

SUMMARY OF THE INVENTION

The invention is designed to solve the above problems, and provides a color filter array in which a mixed light of blue light and red light emits from a light-emitting source and a color filter is formed including a color conversion material and a light blocking material, and an organic light-emitting display device using the source and filter.

A color filter array receiving a mixed light of blue wavelength and red wavelength lights to implement full color according to an embodiment of the invention comprises a red filter, a green filter, and a blue filter. The red filter comprises a first color conversion material for converting the blue light to green light and red light, and a green blocking material for blocking the green light. The green filter comprises a second color conversion material for converting the blue light to green light and red light, and a red blocking material for blocking the red light. The blue filter comprisies a red blocking material for blocking the red light.

In addition, an organic light-emitting display device according to another embodiment of the invention comprises a substrate, a first electrode formed on one surface of the substrate, an organic light-emitting layer formed on the first electrode that emits a mixed light of blue light and red light, a second electrode formed on the organic light-emitting layer, and a red filter, a green filter, and a blue filter formed on the other surface of the substrate. The red filter comprises a first color conversion material for converting blue light from the organic light-emitting layer to green light and red light, and a green blocking material for blocking the green light. The green filter comprises a second color conversion material for converting blue light from the organic light-emitting layer to green light and red light, and a red blocking material for blocking the red light. The blue filter comprises a red blocking material for blocking the red light from the organic light-emitting layer.

In addition, an organic light-emitting display device according to still another embodiment of the invention comprises a substrate, a first electrode formed on one surface of the substrate, an organic light-emitting layer formed on the first electrode for emitting a mixed light of blue light and red light, a second electrode formed on the organic light-emitting layer, and a red filter, a green filter, and a blue filter formed on the outside of the second electrode. The red filter comprises a first color conversion material for converting blue light from the organic light-emitting layer to green light and red light, and a green blocking material for blocking the green light. The green filter comprises a second color conversion material for converting blue light from the organic light-emitting layer to green light and red light, and a red blocking material for blocking the red light. The blue filter comprises a red blocking material for blocking the red light from the organic light-emitting layer.

In addition, a red filter according to another embodiment of the invention comprises a color conversion material for converting blue light emitted from a light-emitting source radiating blue light and red light into green light and red light, and a green blocking material for blocking the green light.

In addition, an organic light-emitting display device according to another embodiment of the invention comprises a substrate, a first electrode formed on one surface of the substrate, an organic light-emitting layer formed on the first electrode for emitting a mixed light of blue light and red light, a second electrode formed on the organic light-emitting layer, and a red filter formed on the red pixel region of the other surface of the substrate, wherein the red filter comprises a color conversion material for converting the blue light emitted from the organic light-emitting layer into green light and red light, and a green blocking material for blocking the green light.

In addition, an organic light-emitting display device according to still another embodiment of the invention comprises a substrate, a first electrode formed on one surface of the substrate, an organic light-emitting layer formed on the first electrode for emitting a mixed light of blue light and red light, a second electrode formed on the organic light-emitting layer, and a red filter formed on a red pixel region of the outside of the second electrode, wherein the red filter comprises a color conversion material for converting the blue light emitted from the organic light-emitting layer into green light and red light, and a green blocking material for blocking the green light.

In addition, a green filter according to another embodiment of the invention comprises a color conversion material for converting blue light emitted from a light-emitting source radiating blue light and red light into green light and red light, and a red blocking material for blocking the red light.

In addition, an organic light-emitting display device according to still another embodiment of the invention comprises a substrate, a first electrode formed on one surface of the substrate, an organic light-emitting layer formed on the first electrode for emitting a mixed light of blue light and red light, a second electrode formed on the organic light-emitting layer, and a green filter formed on a green pixel region of the other surface of the substrate, wherein the green filter comprises a color conversion material for converting the blue light emitted from the organic light-emitting layer into green light and red light, and a red blocking material for blocking the green light.

In addition, an organic light-emitting display device according to still another embodiment of the invention comprises a substrate, a first electrode formed on one surface of the substrate, an organic light-emitting layer formed on the first electrode for emitting a mixed light of blue light and red light, a second electrode formed on the organic light-emitting layer, and a green filter formed on the outside of the second electrode, wherein the green filter comprises a color conversion material for converting the blue light emitted from the organic light-emitting layer into green light and red light, and a red blocking material for blocking the red light.

A color filter array according to the invention and an organic light-emitting display device employing such a color filter array improves the light-emitting efficiency and color coordinate values of red and green light for implementing full color from a mixed light of blue light and red light.

Further, the color filter array according to the invention improves manufacturing efficiency by providing the same color conversion materials to the red filter and green filter.

Still further, for the organic light-emitting display device according to the invention, the variation of color coordinate values according to the driving voltage and current density is not severe since its light-emitting layer is composed only of red and blue colors.

BRIEF DESCRIPTION OF THE DRAWINGS

These and other objects and advantages of the invention will become apparent and more readily appreciated from the following description of exemplary embodiments, taken in conjunction with the accompanying drawings of which.

DETAILED DESCRIPTION

Figure 2:
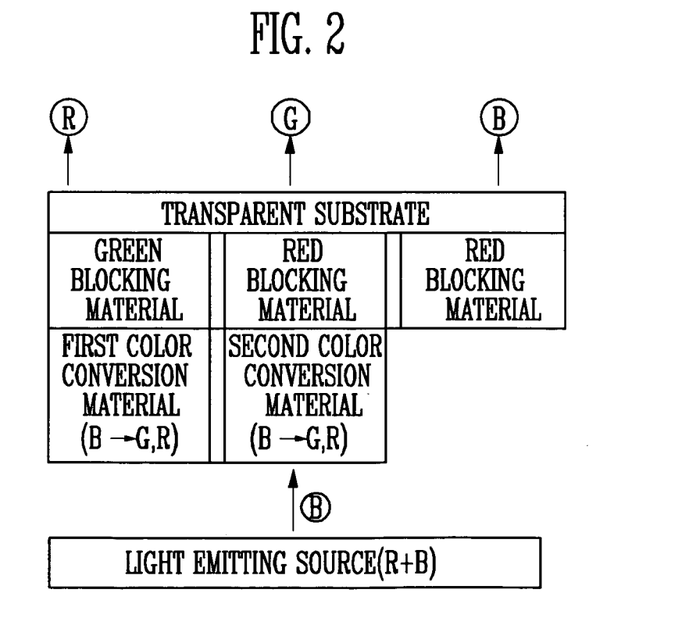
FIG. 2 is a schematic diagram illustrating an embodiment of a color filter array according to one embodiment of the invention.

Hereinafter, embodiments of a color filter array according to the invention will be described in more detail with reference to FIG. 2. FIG. 2 is a construction diagram of a color filter array according to an embodiment of the invention. According to FIG. 2, a color filter array comprises a transparent substrate, a red filter, a green filter, and a blue filter. In one embodiment, a light-emitting source used in the color filter is a light source in which blue and red lights are mixed. The light emitting source may be provided as a single layer or in multiple layers. The X coordinate is in the range of from 0.20 to 0.50, and the Y coordinate is in the range of from 0.20 to 0.43.

Figure 3:
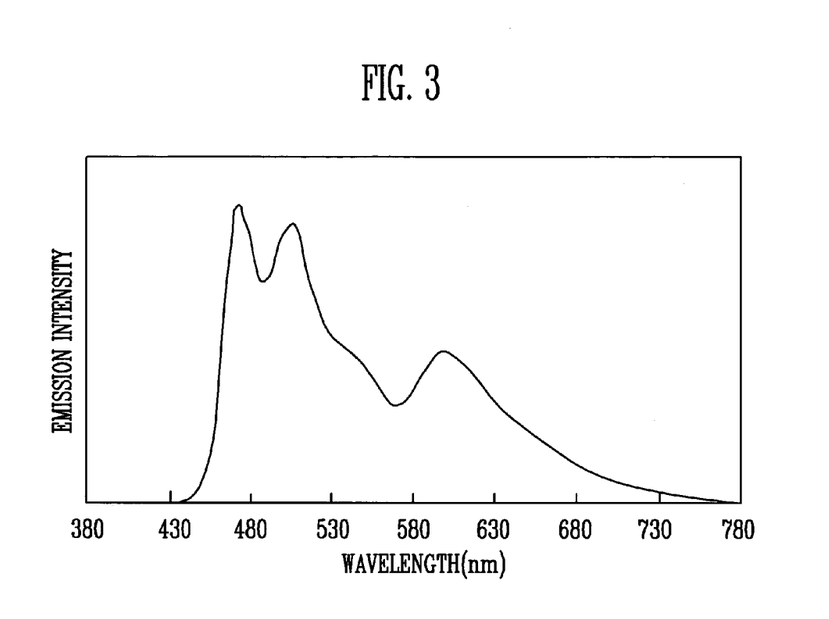
FIG. 3 is a graph showing a light-emitting spectrum of a light-emitting source used in a color filter array according to one embodiment of the invention.

FIG. 3 shows a light-emitting spectrum of a light source used in the color filter for an embodiment where a light-emitting source emits only blue light and red light, and for this embodiment, there are advantages in that the variation of color coordinate values of the light-emitting source is not severe according to driving voltage and current density, and the light-emitting source is easily manufactured.

In one embodiment, the transparent substrate on which color filters having the respective colors are formed, is made of a transparent material such as glass, transparent polymer, etc.

Figure 4:
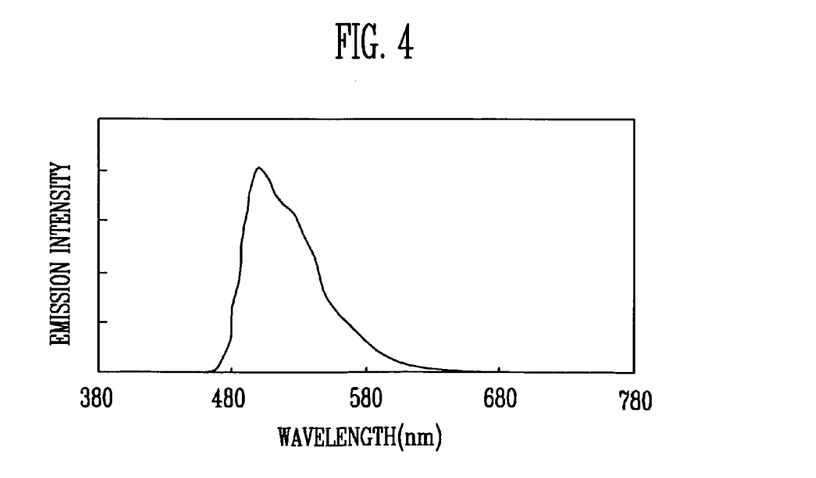
FIG. 4 is a graph showing a light-emitting spectrum of a color conversion material according to the embodiment of FIG. 2.

In one embodiment, the red filter comprises a first color conversion material and a green blocking material. The first color conversion material converts blue light from a light-emitting source to light with a green wavelength and a small amount of light with a red wavelength, and a graph illustrating a light-emitting spectrum of light penetrating the first color conversion material is shown in FIG. 4. In one embodiment, according to FIG. 4, the wavelength of light ranges from 450 nm to 630 nm and includes a green region ranging from 450 nm to 610 nm and a red region ranging from 610 nm to 630 nm.

In one embodiment, the first color conversion material may be made of a fluorescent pigment and a binder resin or only a fluorescent pigment. In an embodiment, a coumarin derivative such as 3-(2'-benzothiazolyl)-7-diethylaminocoumarin (hereinafter, referred to as coumarin 6), or 3-(2'-benzoimidazolyl)-7-N,N-diethylaminocoumarin (hereinafter, referred to as coumarin 7), Alq3, or inorganic pigments, or organic pigments with fluorescence may be used.

Figure 5:
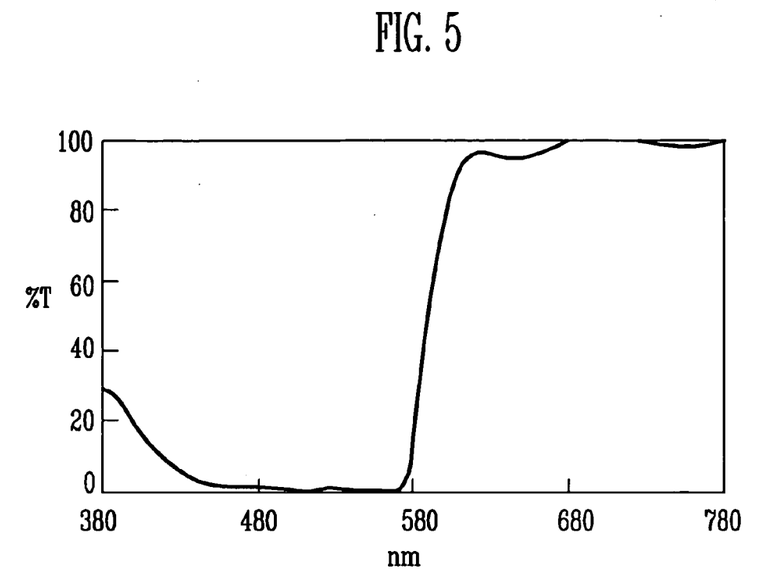
FIG. 5 is a graph showing a transmission diagram of a green blocking material of a red filter according to the embodiment of FIG. 2.

The green blocking material, which in one embodiment is formed abutting the first color conversion material, is composed of a pigment with transmittance over 50% in the wavelength ranging from 600 nm to 780 nm, or a material in which the pigment is dissolved or dispersed into a binder resin. FIG. 5 is a graph illustrating a transmission spectrum of a green blocking material according to one embodiment.

In one embodiment the red filter is configured so that the color conversion material and green blocking material constitute two different layers. In another embodiment, the color filter may be configured with the color conversion material and green blocking material provided as a single mixed layer.

In an embodiment, blue light, which passes through the red filter, is converted to green and red light by the first color conversion material, and the green light is eliminated by a green blocking material and thus only the red light is mixed with the red light from an original light source, leading to high light-emitting efficiency and color coordinate values.

In one embodiment, the green filter comprises a second color conversion material and a red blocking material. The second color conversion may be composed of the same material as the first color conversion material for converting blue light from a light-emitting source into green light and red light. In an embodiment, a coumarin derivative such as 3-(2'-benzothiazolyl)-7-diethylaminocoumarin (hereinafter, referred to as coumarin 6), or 3-(2'-benzoimidazolyl)-7-N,N-diethylaminocoumarin (hereinafter, referred to as coumarin 7), Alq3, or inorganic pigments, or organic pigments with fluorescence may be used as a fluorescent pigment of the second color conversion material.

Figure 6:
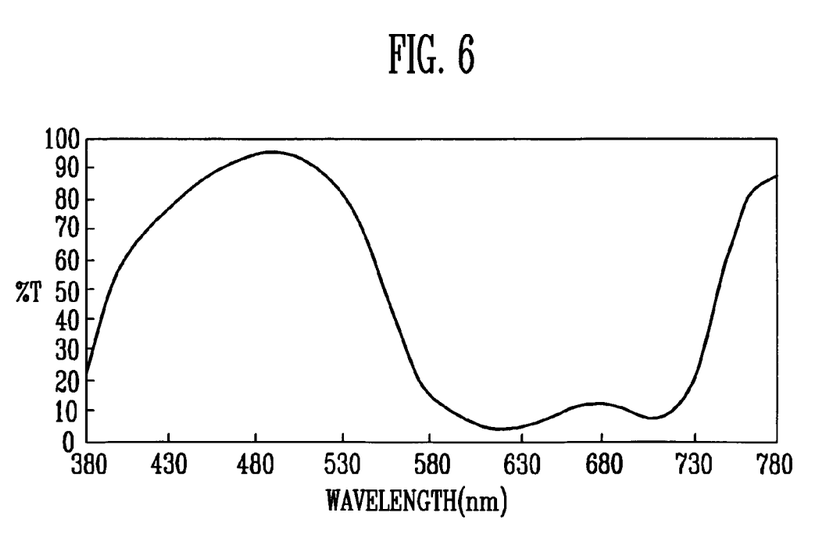
FIG. 6 is a graph showing a transmission diagram of a red blocking material of a green filter according to the embodiment of FIG. 2.

In one embodiment, the red blocking material, which is formed abutting the first color conversion material, is composed of a pigment with transmittance of under 30% in the wavelength ranging from 550 nm to 750 nm and over 60% in the wavelength ranging from 400 nm to 530 nm, or a material in which the pigment is dissolved or dispersed into a binder resin. In an embodiment, if the red blocking material is composed of only a pigment for blocking red color, it is more easily manufactured. FIG. 6 is a graph illustrating a transmission spectrum of a red blocking material according to an embodiment of the invention.

In one embodiment the green filter is configured so that the second color conversion material and red blocking material constitute two different layers. In another embodiment, the second color conversion material and red blocking material are provided as a single mixed layer.

In an embodiment when the blue light passes through the green filter, it is converted into green light and red light by the second color conversion material, and the converted red light and the red light from the light source are eliminated by a red blocking material, and thus only the green light remains.

In one embodiment, a blue filter comprises a red blocking material for blocking the red light from a light-emitting source. In an embodiment, cyanine series pigments, copper phthalocyanine series pigments, indanthrone series pigments, dioxazine series pigments, or mixtures thereof may be used as a pigment for the blue filter. When radiated light passes through the blue filter, red light is blocked by the red blocking material, and only blue light remains.

In one embodiment, the color filter array may be manufactured by coating a black matrix on a transparent substrate, forming a black matrix pattern along the location where color filters with each color will be coated, and coating and patterning the color filters sequentially with each color in accordance with the pattern.

A flat panel display device using a color filter array according to an embodiment of the invention will be described below in more detail, in which the above-mentioned color filter array is applied to an organic light-emitting display device, which is one example of the flat display devices. However, it would be understood by those skilled in the art that the green filter may also be applied to a variety of display devices other than the organic light-emitting display devices such as liquid crystal display devices.

Figure 7:
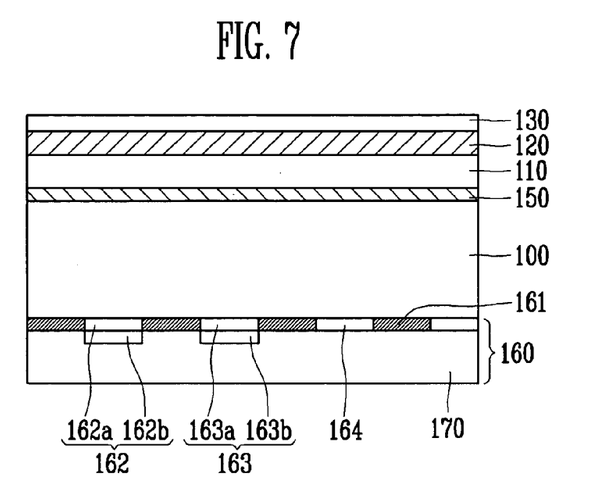
FIG. 7 is a sectional view illustrating an embodiment of an organic light-emitting display device to which a color filter array is applied according to an embodiment of the invention.

FIG. 7 is a sectional view illustrating a bottom emitting organic light-emitting display device to which a color filter array is applied according to an embodiment of the invention. According to FIG. 7, an organic light-emitting display device comprises a substrate 100, a first electrode 110, an organic light-emitting layer 120, a second electrode 130, and a color filter array 160.

In an embodiment, a glass or a transparent plastic with excellent transparency, surface flatness, easy-to-handle characteristics, and water proof/resistance may be used as the substrate.

In an embodiment, a general electrode may also be used for the first and second electrodes 110, 120 without any limitation in the invention, and thus the detailed description will be omitted. In one embodiment, for an anode electrode, ITO, IZO, SnO2, or ZnO may be used, and for a cathode electrode, Li, Mg, Al, Al—Li, Ca, Mg—In, Mg—Ag, etc. may be used.

In an embodiment, the organic light-emitting layer 120 is configured to emit a mixed light of blue light and red light. In this specification, the term "organic light-emitting layer" is used as a concept essentially including a light-emitting layer, and optionally including a hole injection layer, a hole transporting layer, an emissive layer, a hole blocking layer, an electron injection layer, and a electron transport layer. The details relating to components and functions of the respective layers are well known to those skilled in the art, and thus a detailed description will be omitted. Furthermore, while the organic light-emitting layer is generally described as a single layer, it is understood that two or more layers may be used to form the organic light-emitting layer.

The organic light-emitting layer may be configured in a variety of ways. In one embodiment, separate blue and red light-emitting layers may be formed. In another embodiment multiple blue and red light-emitting layers may be provided in a stacked arrangement.

In an embodiment, the material for emitting blue light may be selected from the group consisting of chemical formula 1, 2, 3, 4, 5, 6, 7, 8, 9, and combinations thereof as follows:

Chemical formula 1

Chemical formula 2

Chemical formula 6

Chemical formula 3

Chemical formula 7

Chemical formula 4

Chemical formula 8

Chemical formula 5

Chemical formula 9

In another embodiment, the material for emitting red light may be selected from the group consisting of chemical formula 10, 11, 12, 13, 14, 15 and combinations thereof as follows:

Chemical formula 10

Chemical formula 11

Chemical formula 12

Chemical formula 13

Chemical formula 14

Chemical formula 15

In one embodiment, the light-emitting intensity may be efficiently controlled by mixing the materials in an appropriate ratio and by adjusting the thickness of the light-emitting layer and the ratio of the host and dopant. In an embodiment, the color coordinate values of the mixed light ranges from 0.20 to 0.50 in its X coordinate, and from 0.20 to 0.43 in its Y coordinate.

For the embodiment of FIG. 7, the color filter array 160 is provided on the surface opposite to the surface on which an organic light-emitting element is formed, and includes a transparent substrate 165, a red filter 162, a green filter 163, and a blue filter 164.

In an embodiment, the red filter 162 comprises a first color conversion layer 162a comprising a first color conversion material and a green blocking layer 162b comprising a green blocking material. In one embodiment, the first color conversion material for the first color conversion layer 162a is made of a material for converting blue light from the organic light-emitting layer 120 into green light and a small amount of red light, with the wavelength of the converted light ranging from 450 nm to 630 nm, which includes the green region ranging from 450 nm to 610 nm. and a small amount of the red region ranging from 610 to 630 nm, as described above.

In one embodiment, the material of the first color conversion material may be made of both a fluorescent pigment and a binder resin or only a fluorescent pigment. In an embodiment, the fluorescent pigment may be, for example, a coumarin derivative such as 3-(2'-benzothiazolyl)-7-diethylaminocoumarin (hereinafter, referred to as coumarin 6), or 3-(2'-benzoimidazolyl)-7-N,N-diethylaminocoumarin (hereinafter, referred to as coumarin 7), inorganic pigments with fluorescence, or organic pigments with fluorescence.

In an embodiment, the first color conversion layer 162a may be formed by forming a film of a color conversion resin composition on the substrate to a desired thickness. In one embodiment, the film-forming method may include spin coating, printing, coating, and the like. In an embodiment, a patterning method may be used. In one embodiment, the thickness of the film is in the range of 1 to 30 μm. If the film is less than 1 μm in thickness, the color conversion is not smooth, and if it is more than 30 μm, it becomes difficult to perform the lithography.

In an embodiment, the green blocking layer 162b, which is formed abutting the first color conversion material 162a, comprises a red pigment with a transmittance of over 50% in the wavelength ranging from 600 nm to 780 nm, or a material in which the pigment is dissolved or dispersed into a binder resin.

In one embodiment, the green blocking layer 162b may be created by forming a film on the first color conversion layer 162a to a desired thickness. In an embodiment, the film-forming method may include spin coating, roll coating, bar coating, casting, patterning, and the like. In one embodiment, lithography methods and screen printing methods may be used for patterning after forming the film. In an embodiment, the green blocking layer 162b may be formed in the range of 0.5 to 5 μm in thickness. It is difficult to adjust transparency if the thickness is less than 0.5 μm, and difficult to perform lithography if the thickness is more than 5 μm. In another embodiment, the thickness is in the range of 1 to 2 μm.

In one embodiment, blue light, which passes through the red filter 162, is converted to green light and red light by the first color conversion layer 162a, and the green light is eliminated by a green blocking layer 162b and thus only the red light from the color conversion layer 162a mixed with the red light from the light-emitting source are produced, leading to high light-emitting efficiency and color coordinate values.

In an embodiment, the green filter 163 comprises a second color conversion layer 163a made of a second color conversion material, and a red blocking layer 163b made of a red blocking material. In an embodiment, the second color conversion material comprises a material that may be the same as that of the first color conversion material for converting blue light from a light-emitting source into green light and red light. In one embodiment, the fluorescent pigment of the color conversion material may employ a coumarin derivative such as 3-(2'-benzothiazolyl)-7-diethylaminocoumarin (hereinafter, referred to as coumarin 6), or 3-(2'-benzoimidazolyl)-7-N,N-diethylaminocoumarin (hereinafter, referred to as coumarin 7), Alq3, inorganic pigments with fluorescence, or organic pigments with fluorescence.

In one embodiment, the red blocking layer 163b, which is formed abutting the second color conversion material 163a, comprises a pigment with a transmittance under 30% in the wavelength ranging from 550 nm to 750 nm and over 60% in the wavelength ranging from 400 nm to 530 nm, or a material in which the pigment is dissolved or dispersed into a binder resin. In an embodiment, it is easier to manufacture the red blocking material 163b since it is composed of only the pigment for blocking red light.

In one embodiment, where the blue light passes through the green filter 163, it is converted into green light and red light by the second color conversion layer 163a, and the red light from the color conversion layer and the red light from the light-emitting source are eliminated by a red blocking layer 163b, and thus only the green light remains.

In an embodiment, a blue filter 164 comprises a red blocking material for blocking the red wavelength light from a light-emitting source. In an embodiment, cyanine series pigments, copper phthalocyanine series pigments, indanthrone series pigments, dioxazine series of pigments, or mixtures thereof may be used as a pigment for the blue filter 164. In an embodiment, when light passes through the blue filter 164, red light is blocked by the red blocking material, and only blue light remains.

Other optional components may be included with the organic light-emitting display device according to other embodiments include, for example, a buffer layer 150, and a black matrix 161, and similar components which are well known may be incorporated in various embodiments by those skilled in the art, and thus the detailed description will be omitted for convenience.

In one embodiment, any one of the respective color filters may be formed as a single layer with a color conversion material and a blocking material mixed, as described above. In an embodiment, the thickness of such a single mixed layer is in the range of 1 to 30 μm. If the film is less than 1 μm in thickness, the color conversion is not smooth, and if it is more than 30 μm, it becomes difficult to perform the lithography.

Figure 8:
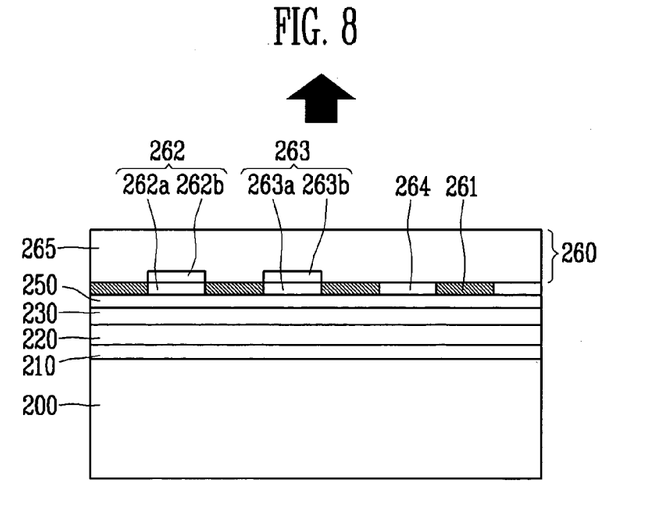
FIG. 8 is a sectional view illustrating another embodiment of an organic light-emitting display device to which a color filter array is applied according to an embodiment of the invention.

FIG. 8 is a sectional view illustrating a top emitting organic light-emitting display device to which a color filter is applied according to the invention. According to the embodiment as shown in FIG. 8, an organic light-emitting display device comprises a substrate 200, a first electrode 210, an organic light-emitting layer 220, a second electrode 230, and a color filter array 260. An optional buffer layer 250 may be provided between the second electrode 230 and the color filter array 260.

For this embodiment, the color filter array 260 is formed on the side of the second electrode 230 rather than on the side of the substrate 200. In one embodiment, an organic light-emitting display device may be manufactured by adjoining the color filter array 260 to the substrate surface formed with organic light-emitting elements.

The color filter array of this embodiment includes a red filter 262, a green filter 263, a blue filter 264, and an optional black matrix 261. The red filter 262 comprises a first color conversion layer 262a and a green blocking layer 262b as described above and the green filter 263 comprises a second color conversion layer 263a and a red blocking layer 263b as described above. A transparent substrate 265 protects the color filters.

In an embodiment, it will be understood by those skilled in the art that the color filter array 260 may be formed with an additive layer easily combined thereto such as a flattened layer.

As illustrated above, a color filter array according to the invention may be applied to either the top surface of the light-emitting structure or the bottom surface light-emitting structure to form top or bottom-emitting structures. However, the color filter array may also be applied to both surfaces of the light-emitting structure to form a dual-emitting structure.

A manufacturing method according to an embodiment of the invention will be described below with reference to FIG. 7, in which a color conversion material and a color blocking material, respectively, are configured in separate layers. The effect of the color filter array according to the invention manufactured by the method will also be described.

First, a black matrix 161 pattern is formed on a transparent substrate 165 and then each of the three color filters 162, 163, 164 is coated on the transparent substrate 165. For first color conversion layer 162a a mixture of 25 mg of coumarin 6 and 2.5 g of PVB (polyvinylbutyral) is dissolved into 7.5 g of (ethyl cellusolve), and is coated on a red pixel region to a thickness less than 10 μm according to the pattern and then dried at 80° C. for a half hour. Then, a green blocking layer 162b is coated on the first color conversion layer and dried at 80° C. for two minutes and patterned, thus forming a red filter 162.

In an embodiment, a second color conversion layer 163a is formed in a green pixel region by the same process as was used for the red filter, and a red blocking layer 163b is coated thereon and patterned, thus forming a green filter 163. In an embodiment, for the blue filter 164, only a red blocking layer is formed in a blue pixel region without separate color conversion material.

Figure 9:
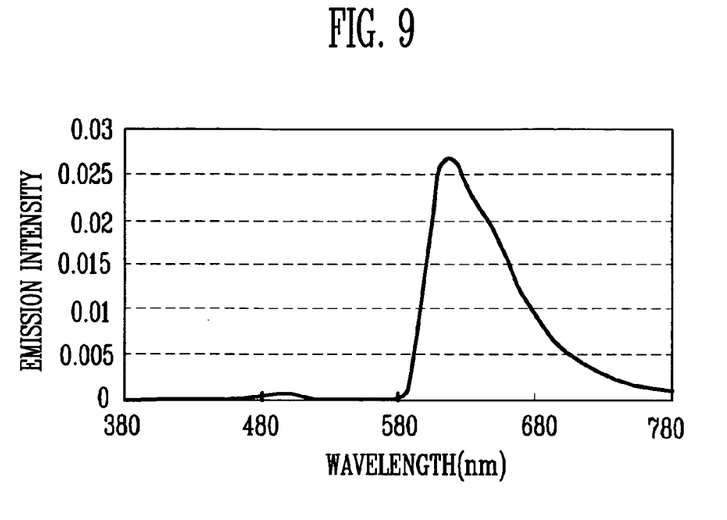
FIG. 9 is a graph of a light-emitting spectrum of an organic light-emitting display device in which a red filter of one embodiment of the invention is formed on a blue and red light-emitting layer.
Figure 10:
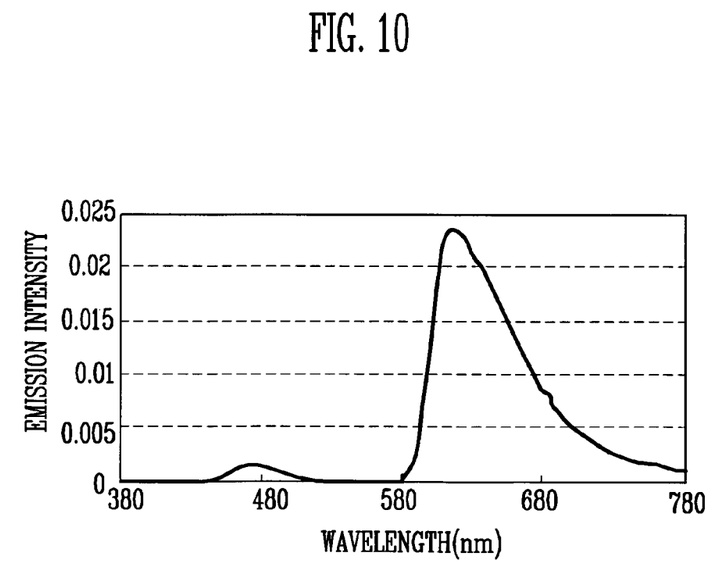
FIG. 10 is a graph of a light-emitting spectrum of an organic light-emitting display device in which a conventional red filter is formed on blue and red light-emitting layers.

FIG. 9 is a graph illustrating the light-emitting spectrum of light radiating from a blue light and red light source and passing through the above-mentioned red filter according to an embodiment of the invention, and FIG. 10 is a graph illustrating the light-emitting spectrum of light passing through a red filter according to a general manufacturing method from the same light source as that in FIG. 9. A comparison of FIG. 10 and FIG. 9 shows the red filter according to the invention transmits little blue wavelength light compared to the general red filter, and has a higher intensity of red wavelength light.

Table 1 compares color coordinate values and light-emitting efficiency of the red filter manufactured by the above-mentioned manufacturing methods and the general red filter according to an embodiment where a mixed light of red and blue light has a color coordinate value of (0.34, 0.38) and an efficiency of 19 cd/A.

TABLE 1

|  | Light source | Practical example | Comparative example |
| --- | --- | --- | --- |
| Color coordinates | (0.34, 0.38) | (0.67, 0.32) | (0.65, 0.31) |
| Light-emitting efficiency(cd/A) | 18 | 5.5 | 5.2 |

Color coordinate values of a red filter according to an embodiment of the invention are (0.67, 0.32), which may provide improved red light emission compared to the color coordinate values (0.65, 0.31) of the general red filter, as shown by Table 1. In addition, the light-emitting efficiency for a red filter of the present invention is highly improved compared to a general red filter.

Figure 11:
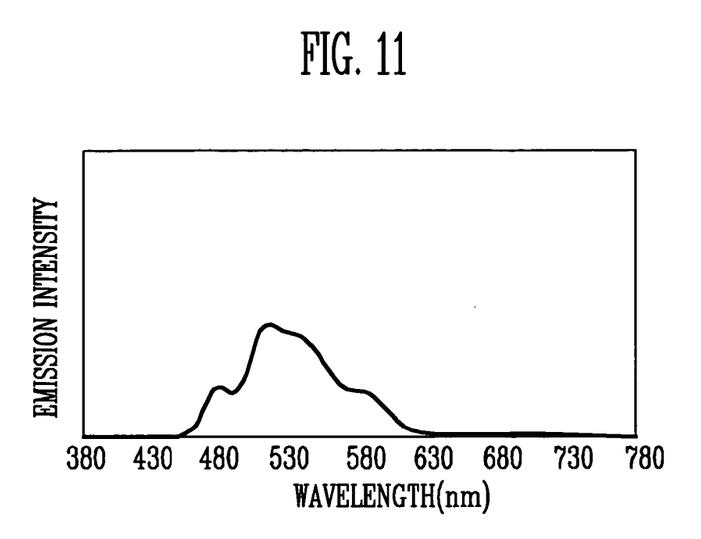
FIG. 11 is a graph of a light-emitting spectrum of an organic light-emitting display device in which a conventional green filter is formed on a blue and red light-emitting layer.
Figure 12:
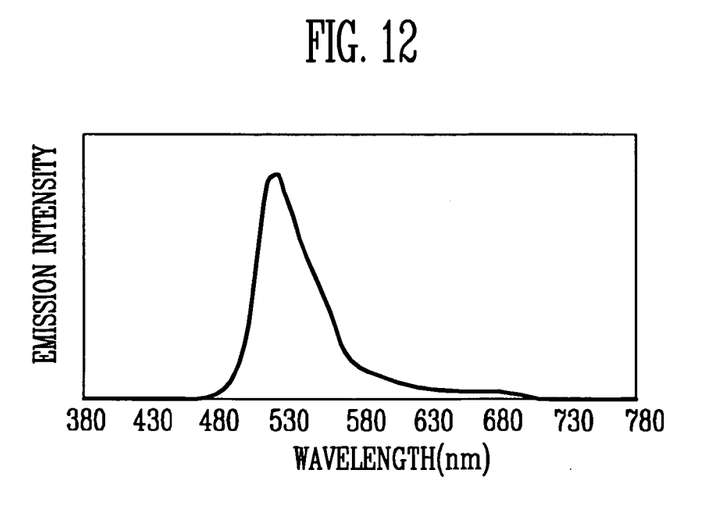
FIG. 12 is a graph of a light-emitting spectrum of an organic light-emitting display device in which a green filter according to one embodiment of the invention is formed on a blue and a red light-emitting layer.

FIG. 11 is a graph illustrating a light-emitting spectrum radiating from a mixed light source of blue light and red light passing through the above-mentioned green filter according to an embodiment of the invention, and FIG. 12 is a graph illustrating the light-emitting spectrum of light passing through a green filter according to a general manufacturing method from the same light source as that in FIG. 11. A comparison of FIG. 12 and FIG. 11 shows the green filter according to an embodiment of the invention has higher intensity in higher green wavelength regions than the case where the general green filter is applied.

Table 2 shows the comparison of color coordinate values and light-emitting efficiency of the green filter manufactured by the above-mentioned manufacturing method according to an embodiment of the invention, and the general green filter, where a mixed light source of red light and blue light with color coordinate values (0.32, 0.41).

TABLE 2

|  | Light source | Practical example | Comparative example |
| --- | --- | --- | --- |
| Color coordinates | (0.32, 0.41) | (0.22, 0.67) | (0.27, 0.56) |
| Light-emitting efficiency(cd/A) | 11.7 | 6.5 | 5.4 |

Color coordinate values of a green filter according to an embodiment of the invention are (0.22, 0.67), which provides an improved red light emission compared to the color coordinate values (0.27, 0.56) of the general green filter as shown in Table 2. In addition, the light-emitting efficiency of 6.5 cd/A for the green filter of the invention is highly improved compared to a general green filter.

Table 3 shows the color coordinate values and light-emitting efficiency of light passing through the red filter and green filter where the color coordinate values and light-emitting efficiency of the mixed light of red and green light are different from those of the above-mentioned embodiment.

TABLE 3

|  | Light-emitting efficiency(cd/A) | Color coordinates |
| --- | --- | --- |
| Light source | 18 | (0.34, 0.38) |
| Red light after passing through the color filter | 5.5 | (0.67, 0.32) |
| green light after passing through the color filter | 9.5 | (0.25, 0.65) |
| blue light after passing through the color filter | 3.6 | (0.10, 0.21) |

Figure 13:
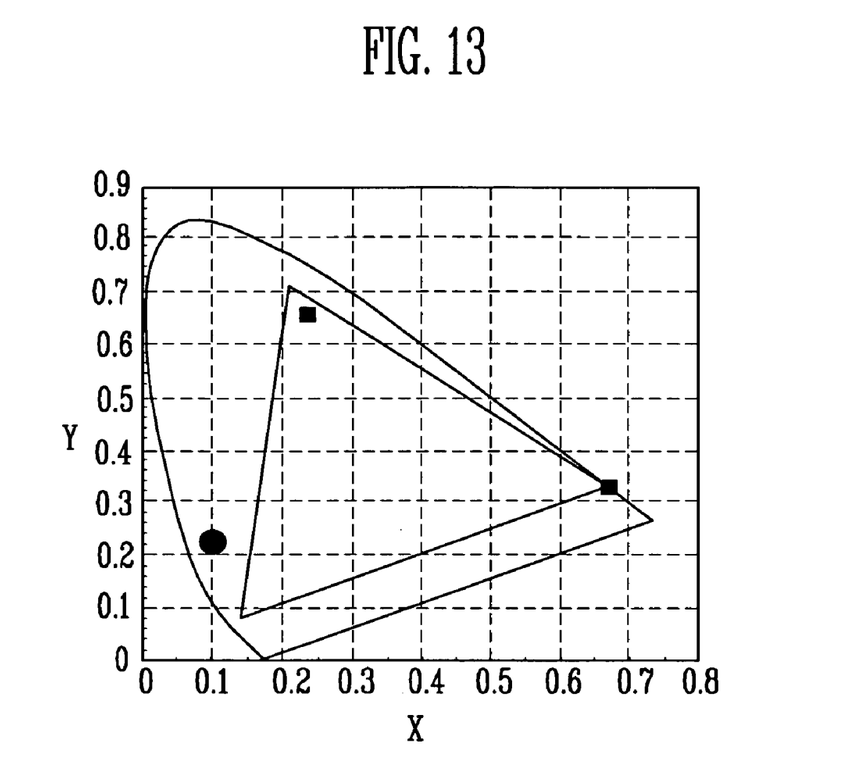
FIG. 13 is a graph illustrating improved color coordinate values of an organic light-emitting display device according to one embodiment of the invention.

FIG. 13 is a graph illustrating the color coordinate values of Table 3. It may be seen that a full color reproduction range, which amounts to 74% can be implemented.

In an embodiment, it may be possible to employ the color filter of the invention for any one filter of respective color filters like a red filter. Additionally, one may employ other well known filters for other color filters like the green filter, and vice versa. In addition, variations of material constituting the organic light-emitting layer, the components and thickness of the color conversion layer or the green blocking layer and the like may be easily made by those skilled in the art.

While the invention has particularly shown and described with reference to exemplary embodiments thereof, it will be understood by those skilled in the art that the foregoing and other changes in form and details can be made therein without departing from the spirit and scope of the appended claims and their equivalents.

What is claimed is:

1. A color filter array adapted to receive a mixed light of blue light and red light and emit red light from a red pixel region, green light from a green pixel region and blue light from a blue pixel region, the color filter array comprising:
    a color conversion layer comprising a compound adapted to convert blue light emitted from a red and blue light-emitting source into green light and red light, wherein the color conversion layer is situated over both the red pixel region and the green pixel region; and
    a red color blocking layer comprising a material adapted to block red light, wherein the red color blocking layer is situated over the green pixel region and the blue pixel region; and
    a green color blocking material adapted to block green light, wherein the green color blocking material is situated over the red pixel region,
    wherein the color conversion layer consists essentially of the same material throughout the color conversion layer.

2. The color filter array of claim 1, wherein a transmittance of the green blocking material is above 50% in the wavelength range of 600 nm to 780 nm.

3. The color filter array of claim 1, wherein a transmittance of the red blocking material is below 30% in the wavelength range of 550 nm to 750 nm and above 60% in the wavelength range of 400 nm to 530 nm.

4. The color filter as claimed in claim 1, wherein the color conversion layer and the color blocking materials are provided as separate layer.

5. The color filter as claimed in claim 1, wherein the color conversion material and the color blocking materials are provided as a single layer.

6. A color filter array adapted to receive a mixed light of blue light and red light to implement full color by emitting red light from a red pixel region, green light from a green pixel region and blue light from a blue pixel region, the color filter array comprising:
- a red filter comprising a first portion of a color conversion layer comprising a compound adapted to convert the blue light into green light and red light, and a green blocking material adapted to block the green light, wherein the first portion of the color conversion layer is situated over the red pixel region;
- a green filter comprising a second portion of the color conversion layer, and a first portion of a red blocking layer comprising a material adapted to block the red light, wherein the compound is selected from the group consisting of coumarin derivatives, Alq3, inorganic pigments with fluorescence, organic pigments with fluorescence, and combinations thereof, wherein the second portion of the color conversion layer is situated over the green pixel region; and
- a blue filter comprising a second portion of the red blocking layer comprising a material adapted to block the red light,
- wherein the first portion and the second portion of the color conversion layer consist essentially of the same material.

7. The color filter array as claimed in claim 6, wherein the compound comprises a coumarin derivative selected from the group consisting of coumarin 6, coumarin 7, and combinations thereof.

8. The color filter array as claimed in claim 6, wherein a transmittance of the green blocking material is above 50% in the wavelength range of 600 nm to 780 nm.

9. The color filter array as claimed in claim 6, wherein the red blocking material in the green filter and the red blocking material in the blue filter each have a transmittance below 30% in the wavelength range of 550 nm to 750 nm, and above 60% in the wavelength range of 400 nm to 530 nm.

10. The color filter array as claimed in claim 6, wherein the color conversion layer and the green blocking material are provided as separate layers.

11. The color filter array as claimed in claim 6, wherein the color conversion material and the green blocking material are provided as a single layer.

12. The color filter array as claimed in claim 6, wherein the color conversion layer and the red blocking material are provided as separate layers.

13. The color filter array as claimed in claim 6, wherein the color conversion material and the red blocking material are provided as a single layer.

14. An organic light-emitting display device comprising:
- a substrate defining first and second opposing surfaces;
- a first electrode provided on the first surface of the substrate;
- an organic light-emitting layer provided on the first electrode and adapted to emit a mixed light of blue light and red light;
- a second electrode provided on the organic light-emitting layer; and
- a color filter array provided on at least one of the second electrode or the second surface of the substrate, the color filter array comprising:
- a red filter corresponding to a red pixel region, the red filter comprising a first portion of a color conversion layer comprising a compound adapted to convert the blue light emitted from the organic light-emitting layer into green light and red light, and a green blocking material adapted to block the green light, wherein the first portion is situated over the red pixel region;
- a green filter corresponding to a green pixel region, the green filter comprising a second portion of the color conversion layer; and a red blocking material adapted to block the red light, wherein the second portion is situated over the green pixel region; and
- a blue filter comprising a red blocking material adapted to block the red light emitted from the organic light-emitting layer,
- wherein the first portion and the second portion of the color conversion layer consist essentially of the same material.

15. The organic light-emitting display device as claimed in claim 14, wherein the color filter array is separated from the second electrode or the second surface of the substrate by a buffer layer.

16. The organic light-emitting display device as claimed in claim 14, wherein the color filter array is provided on the second electrode.

17. The organic light-emitting display device as claimed in claim 14, wherein the color filter array is provided on the second surface of the substrate.

18. The organic light-emitting display device as claimed in claim 14, wherein the color filter array is a first color filter array provided on the second electrode; the device further comprising a second color filter array provided on the second surface of the substrate.

19. The organic light-emitting display device as claimed in claim 14, wherein color coordinate values of the mixed light are in the range of X=0.20 to 0.50 , and Y=0.20 to 0.43.

20. The organic light-emitting display device as claimed in claim 14, wherein the organic light-emitting layer comprises a material selected from the group consisting of:

Chemical formula 1

Chemical formula 2

Chemical formula 3

Chemical formula 4

Chemical formula 5

Chemical formula 6

Chemical formula 7

Chemical formula 8

Chemical formula 9

; and mixtures thereof.

21. The organic light-emitting display device as claimed in claim 20 wherein the organic light-emitting layer further comprises a material selected from the group consisting of:

Chemical formula 10

Chemical formula 11

Chemical formula 12

-continued

Chemical formula 13

Chemical formula 14 and combinations thereof.

22. The organic light-emitting display device as claimed in claim 14, wherein the organic light-emitting layer comprises a material selected from the group consisting of:

Chemical formula 10

Chemical formula 11

-continued

Chemical formula 12

Chemical formula 13

Chemical formula 14

Chemical formula 15 and combinations thereof.

23. The organic light-emitting display device as claimed in claim 14, wherein a transmittance of the green blocking material is above 50% in the wavelength range of 600 nm to 780 nm.

24. The organic light-emitting display device as claimed in claim 14, wherein a transmittance of the red blocking material is below 30% in the wavelength range of 550 nm to 750 nm and above 60% in the wavelength range of 400 nm to 530 nm.

25. The organic light-emitting display device as claimed in claim 14, wherein the color conversion layer is provided as a first layer and the green blocking material is provided as a second layer.

26. The organic light-emitting display device as claimed in claim 25, wherein the thickness of the first layer is from 1 to 30 μm, and the thickness of the second layer is from 0.5 to 5 μm.

27. The organic light-emitting display device as claimed in claim 14, wherein the color conversion material and the color blocking material are provided as a single layer.

28. The organic light-emitting display device as claimed in claim 27, wherein the thickness of the layer comprising the color conversion material and the color blocking material is from 1 to 10 μm.

29. The organic light-emitting display device as claimed in claim 14, wherein the color conversion layer is provided as a first layer and the green blocking material is provided as a second layer.

30. The organic light-emitting display device as claimed in claim 29, wherein the thickness of the first layer is from 1 to 30 μm, and the thickness of the second layer is from 0.5 to 5 μm.

31. The organic light-emitting display device as claimed in claim 14, wherein for at least one of the red filter and the green filter, the corresponding color conversion material and the corresponding green or red blocking material comprise a single layer.

32. The organic light-emitting display device as claimed in claim 31 wherein the thickness of the single layer is from 1 to 10 μm.

33. The color filter array of claim 1, wherein the red color blocking material comprises a material selected from the group consisting of cyanine series pigments, copper phthalocyanine series pigments, indanthrone series pigments, dioxazine series of pigments, and combinations thereof.

* * * * *